United States Patent
Pane et al.

(10) Patent No.: US 7,536,621 B2
(45) Date of Patent: May 19, 2009

(54) QUANTIZED DATA-DEPENDENT JITTER INJECTION USING DISCRETE SAMPLES

(75) Inventors: John R. Pane, Tigard, OR (US); Corbin L. Champion, Tigard, OR (US)

(73) Assignee: Teradyne, Inc., North Reading, MA (US)

(*) Notice: Subject to any disclaimer, the term of this patent is extended or adjusted under 35 U.S.C. 154(b) by 298 days.

(21) Appl. No.: 11/608,460

(22) Filed: Dec. 8, 2006

(65) Prior Publication Data

US 2008/0141090 A1    Jun. 12, 2008

(51) Int. Cl.
*G06F 11/00* (2006.01)
*H04L 7/00* (2006.01)

(52) U.S. Cl. .................. 714/738; 714/815; 375/371
(58) Field of Classification Search ............... None
See application file for complete search history.

(56) References Cited

U.S. PATENT DOCUMENTS

| | | | |
|---|---|---|---|
| 6,335,954 B1 * | 1/2002 | Bottomley et al. | 375/354 |
| 7,315,574 B2 * | 1/2008 | Hafed et al. | 375/226 |
| 7,466,140 B2 * | 12/2008 | Ichiyama et al. | 324/537 |
| 2004/0205431 A1 | 10/2004 | Moore et al. | |
| 2006/0100801 A1 | 5/2006 | Tabatabaei et al. | |

OTHER PUBLICATIONS

Masashi Shimanouchi, "Periodic Jitter Injection with Direct Time Synthesis by SPPTM ATE for SerDes Jitter Tolerance Test in Production," *itc*, p. 48, International Test Conference 2003 (ITC'03), 2003.

International Search Report and Written Opinion of the International Searching Authority, for International Application No. PCT/US2007/086467 dated Apr. 11, 2008.

* cited by examiner

*Primary Examiner*—Christine T Tu
(74) *Attorney, Agent, or Firm*—Fish & Richardson P.C.

(57) ABSTRACT

Methods, system, and computer programs for compensating for introducing data dependent jitter into a test signal using a testing instrument are disclosed. The method includes generating a test pattern that comprises a plurality of intervals. Each of the intervals includes a number of redundant samples that correspond to a sample in a test source pattern. The test pattern is digitally modified to generate a modified test pattern that includes data dependent jitter.

21 Claims, 14 Drawing Sheets

QUANTIZED DATA-DEPENDENT JITTER INJECTION USING DISCRETE SAMPLES

TECHNICAL FIELD

Methods, systems, and computer programs for introducing data dependent jitter into a test signal using a testing instrument are disclosed.

BACKGROUND

Automatic test equipment (ATE) refers to an automated, usually computer-driven, system for testing devices, such as semiconductors, electronic circuits, and printed circuit board assemblies. A device tested by ATE is referred to as a device under test (DUT).

ATE typically includes a computer system and a testing device or a single device having corresponding functionality. Pin electronics are typically part of the testing device. Pin electronics includes drivers, comparators and/or active load functionality for testing a DUT. The drivers provide test signals to pins on the testing device. ATE is capable of providing different types of signals to a DUT. Among these signals are the test signals noted above, which are used during testing of the DUT (e.g., to test the DUT).

SUMMARY

In general in one aspect, the invention features a method that includes generating a test pattern that comprises a plurality of intervals. Each of the intervals include a number of redundant samples that correspond to a sample in a test source pattern. The number of redundant samples is based on a difference between an operating frequency of a tester and an operating frequency of a device under test. The operating frequency of the tester is greater than the operating frequency of the device under test. The method also includes digitally modifying the test pattern to generate a modified test pattern that includes data dependent jitter.

Embodiments can include one or more of the following.

The method can include applying the modified test pattern to the device under test at the operating frequency of the tester. Digitally modifying the test pattern can include replacing one or more samples from a particular interval with a sample from an interval preceding the particular interval. Replacing one or more samples can include replacing the first sample in the interval with the last sample from an immediately preceding interval. Digitally modifying the test pattern can include replacing one or more samples from a particular interval with a sample from an interval subsequent to the particular interval. Replacing one or more samples can include replacing the final sample in the interval with the first sample from an immediately subsequent interval. The number of samples can be about equal to a ratio of the operating frequency of the tester to the operating frequency of the device under test.

The method can also include determining, based on user input, an amount of data dependent jitter to introduce into the test pattern and determining whether to modify one or more samples of a particular interval of the test pattern based on the determined amount of data dependent jitter. The method can include receiving a data dependent jitter algorithm and determining whether to modify one or more samples of a particular interval of the test pattern based on the algorithm.

The method can include determining whether to modify one or more samples of a particular interval of the test pattern based on an algorithm stored in a memory included in the tester. Modifying the test pattern can include applying a software-based algorithm to modify the test pattern and overwriting the test pattern with the modified test pattern. Applying a software-based algorithm to modify the test pattern can include during a first cycle, applying a software-based algorithm to modify the test pattern and, during a second cycle, applying a software-based algorithm to modify the test pattern such that the modifications generated during the first cycle are identical to the modifications generated during the second cycle.

Modifying the test pattern can include modifying the test pattern in real time using a circuit included in the tester. Modifying the test pattern can include, during a first cycle, applying a software-based algorithm to modify the test pattern and, during a second cycle, applying a software-based algorithm to modify the test pattern such that the modifications generated during the first cycle are identical to the modifications generated during the second cycle.

In general, in one aspect, the invention features a testing system that includes a tester. The tester is configured to generate a test pattern that comprises a plurality of intervals. Each of the intervals includes a number of redundant samples corresponding to a sample in a test source pattern. The number of redundant samples is based on a difference between an operating frequency of a tester and an operating frequency of a device under test where the operating frequency of the tester is greater than the operating frequency of the device under test. The tester is also configured to digitally modify the test pattern to generate a modified test pattern that includes data dependent jitter.

Embodiments can include one or more of the following.

The tester can include an analog front end configured to apply the modified test pattern to the device under test at the operating frequency of the tester. The configurations that cause the tester to digitally modify the test, pattern can include configurations to replace one or more samples from a particular interval with a sample from an interval preceding the particular interval. The configurations that cause the tester to replace the one or more samples can include configurations to cause the tester to replace the first sample in the interval with the last sample from an immediately preceding interval. The configurations that cause the tester to digitally modify the test pattern can include configurations to replace one or more samples from a particular interval with a sample from an interval subsequent to the particular interval. The configurations that cause the tester to replace the one or more samples can include configurations to cause the tester to replace the final sample in the interval with the first sample from an immediately subsequent interval. The tester can further include a memory configured to store an algorithm for determining whether to modify one or more samples of a particular interval of the test pattern.

For certain applications it is desirable to insert a known variation in what is termed by the industry as jitter onto the test signals delivered to the device unser test (DUT). Jitter can be broken info several smaller more specific components (Rj, DDj, DCD). Delivering data dependent jitter (DDj) requires the ability to modify the signal delivered to the DUT with sub-User interval capability.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
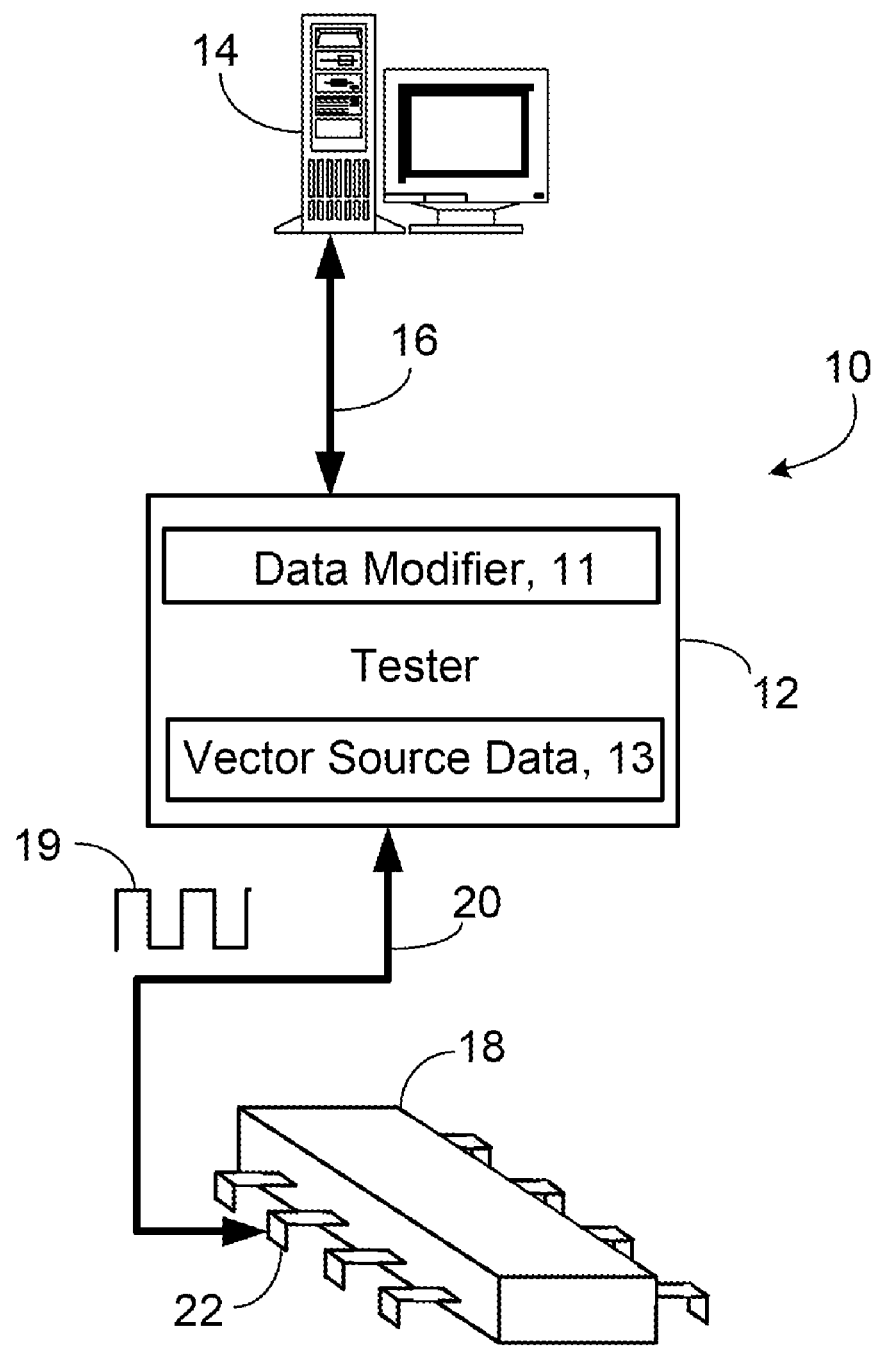
FIG. 1 is a block diagram of ATE for testing devices.

Referring to FIG. 1, a system 10 for testing a device-under-test (DUT) 18, such as a semiconductor device, includes a tester 12, such as automatic test equipment (ATE) or other similar testing device. To control tester 12, system 10 includes a computer system 14 that interfaces with tester 12 over a hardwire connection 16. Typically, computer system 14 sends commands to tester 12 that initiate the execution of routines and functions for testing DUT 18. Such executing test routines may initiate the generation and transmission of test signals to the DUT 18 and collect responses from the DUT. Various types of DUTs may be tested by system 10. For example, DUTs may be semiconductor devices such as an integrated circuit (IC) chip (e.g., memory chip, microprocessor, analog-to-digital converter, digital-to-analog converter, etc.).

To provide test signals and collect responses from the DUT, tester 12 is connected to one or more connector pins that provide an interface for the internal circuitry of DUT 18. To test some Dills, e.g., as many as sixteen, thirty-two, sixty-four, or one hundred twenty-eight connector pins (or more) may be interfaced to tester 12. For illustrative purposes, in this example, semiconductor device tester 12 is connected to one connector pin of DUT 18 via a hardwire connection. A conductor 20 (e.g., cable) is connected to pin 22 and is used to deliver test signals 19 to the internal circuitry of DUT 18. Conductor 20 also senses signals at pin 22 in response to the test signals provided by semiconductor device tester 12. For example, a voltage signal or a current signal may be sensed at pin 22 in response to the test signal 19 and sent over conductor 20 to tester 12 for analysis. Such single port, tests may also be performed on other pins included in DUT 18. For example, tester 12 may provide test signals to other pins and collect associated signals reflected back over conductors (that deliver the provided signals). By collecting the reflected signals, the input impedance of the pins may be characterized along with other single port testing quantities, in other test scenarios, a digital signal may be sent over conductor 20 to pin 22 for storing a digital value on DUT 18. Once stored, DUT 18 may be accessed to retrieve and send the stored digital value over conductor 20 to tester 12. The retrieved digital value may then be identified to determine if the proper value was stored on DUT 18.

Along with performing one-port measurements, two-port or multi-port tests may also be performed by semiconductor device tester 12. For example, a test signal may be injected over conductor 20 into pin 22 and a response signal may be collected from one or more other pins of DUT 18. This response signal is provided to semiconductor device tester 12 to determine quantities, such as gain response, phase response, and other throughput measurement quantities.

Figure 2:
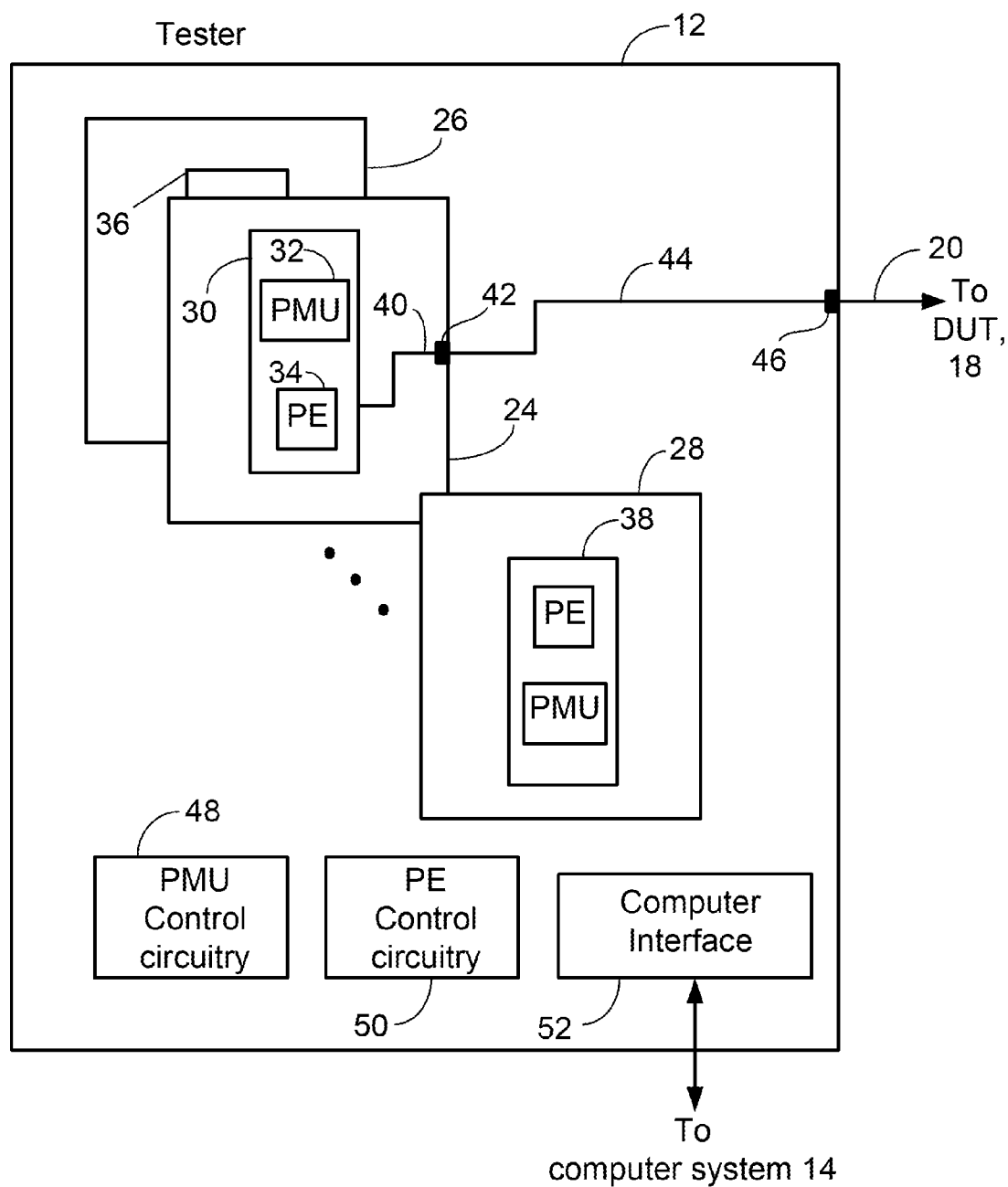
FIG. 2 is a block diagram of a tester used in the ATE.

Referring also to FIG. 2, to send and collect test signals from multiple connector pins of a DUT (or multiple DUTs), tester 12 includes an interface card 24 that can communicate with numerous pins. For example, interface card 24 may transmit test signals to, e.g., 32, 64, or 128 pins and collect corresponding responses. Each communication link to a pin is typically referred to as a channel and, by providing test signals to a large number of channels, testing time is reduced since multiple tests may be performed simultaneously. Output channels typically include drivers (not shown) to provide signals to a DUT, and input channels typically include comparators (also not shown) to, e.g., receive input signals, compare them to a reference, and provide an output. Along with having many channels on an interface card, by including multiple interface cards in tester 12, the overall number of channels increases, thereby further reducing testing time. In this example, two additional interface cards 26 and 28 are shown to demonstrate that multiple interface cards may populate tester 12.

Each interface card includes a dedicated integrated circuit (IC) chip (e.g., an application specific integrated circuit (ASIC), or a field programmable gate array (FPGA)) for performing particular test functions. For example, interface card 24 includes IC chip 30 for performing parametric measurement unit (PMU) tests and pin electronics (PE) tests. IC chip 30 has a PMU stage 32 that includes circuitry for performing PMU tests and a PE stage 34 that includes circuitry for performing PE tests. Additionally, interface cards 26 and 28 respectively include IC chips 36 and 38 that include PMU and PE circuitry. Typically PMU testing involves providing a DC voltage or current signal to the DUT to determine such quantities as input and output impedance, current leakage, and other types of DC performance characterizations. PE testing involves sending AC test signals, or waveforms, to a DUT (e.g., DUT 18) and collecting responses to further characterize the performance of the DUT. For example, IC chip 30 may transmit (to the DUT) AC test signals that represent a vector of binary values for storage on the DUT. Once these binary values have been stored, the DUT may be accessed by tester 12 to determine if the correct binary values have been stored.

To pass both DC and AC test signals from interface card 24 to DUT 18, a conducting trace 40 connects IC chip 30 to an interface board connector 42 that allows signals to be passed on and off interface board 24. Interface board connector 42 is also connected to a conductor 44 that is connected to an interface connector 46, which allows signals to be passed to and from tester 12. In this example, conductor 20 is connected to interface connector 46 for bi-directional signal passage between tester 12 and pin 22 of DUT 18. In some arrangements, an interface device may be used to connect one or more conductors from tester 12 to the DUT. For example, the DUT (e.g., DUT 18) may be mounted onto a device interface board (DIB) for providing access to each DUT pin. In such an arrangement, conductor 20 may be connected to the DIB for placing test signals on the appropriate pin(s) (e.g., pin 22) of the DUT.

In this example, only conducting trace 40 and conductor 44 respectively connect IC chip 30 and interlace board 24 for delivering and collecting signals. However, IC chip 30 (along with IC chips 36 and 38) typically has multiple pins (e.g., eight, sixteen, etc.) that are respectively connected with multiple conducting traces and corresponding conductors for providing and collecting signals from the DUT (via a DIB). Additionally, in some arrangements, tester 12 may connect to two or more DIB's for interfacing the channels provided by interface cards 24, 26, and 28 to one or multiple devices under test.

To initiate and control the testing performed by interface cards 24, 26, and 28, tester 12 includes PMU control circuitry 48 and PE control circuitry 50 that provide test parameters (e.g., test signal voltage level, test signal current level, digital values, etc.) for producing test signals and analyzing DUT responses. The PMU control circuitry and PE control circuitry may be implemented using one or more processing devices. Examples of processing devices include, but are not limited to, a microprocessor, a microcontroller, programmable logic (e.g., a field-programmable gate array), and/or combination(s) thereof. Tester 12 also Includes a computer interface 52 that allows computer system 14 to control the operations executed by tester 12 and also allows data (e.g., test parameters, DUT responses, etc.) to pass between tester 12 and computer system 14.

Referring back to FIG. 1, in some embodiments, the tester 12 introduces jitter into the test signal 19 applied to the device under test 18 to analyze the performance of the device under test 18 in response to the jitter. In general, jitter is the difference between an expected occurrence of a signal edge and the time the edge actually occurs. At a receiving device (e.g., device under test 18), information is extracted from the signal by sampling the signal at specific instants of time, referred to as sampling instances. Ideally these sampling instances would always occur at the center of a data bit time, equidistant between two adjacent edge transition points; however, this is not always the case. The presence of jitter changes the signal edge positions with respect to the sampling instance which can induce errors and loss of synchronization. Tester 12 intentionally shifts the edge position of the test signal 19 applied to the device under test 18 so that the applied test signal 19 appears to include jitter.

Jitter appears as two distinct types: random jitter and deterministic jitter. Random jitter is caused by sources such as device thermal noise. Deterministic jitter can be caused by, but is not limited to, power supply fluctuations, power line noise, cross-talk, duty cycle distortion and data dependent jitter. Data dependant jitter is a component of deterministic jitter that causes timing errors which vary with the data pattern (also referred to as inter-symbol-interference or ISI). Timing errors caused by data dependant jitter can in turn produce duty-cycle distortion or intersymbol interference. Data dependant jitter often results from component and system bandwidth limitations and signal attenuation. The higher frequency components of the transmitted signal have less time to settle than the lower frequency components and are attenuated more quickly. This leads to changes in the start conditions of the signal edges and produces timing errors that are dependent on the data pattern being applied.

Referring to FIG. 2, the tester 12 includes a data modifier 11 that modifies vector source data 13 such that the modified vector source data, when applied to the device under test 18 as test signal 19, appears to include data dependent jitter. Based on the response of the device under test 18 to the test signal 19 that includes data dependent jitter, the tolerance of the device under test 18 to data dependent jitter can be analyzed. The tester 12 is configured to provide repeatability in the jitter injection. Quantized data dependent jitter that is highly repeatable in the jitter's relationship (in time/position) to the source pattern data can be introduced into a test signal. It is believed that providing jitter with a repeatable pattern can provide various advantages in comparison to jitter that is introduced into a test signal randomly. For example, the tester 12 can introduce the same jitter injection will occur based upon the same sequence of source data, therefore, if the same pattern is executed repeatedly from tester 12 to DUT, then the same jitter sequence will be observed each time. It is believed that repeatability is useful for debugging and diagnosing both customer (DUT) faults as well as tester equipment faults. In some implementations, repeatability for customer test conditions is very important because without this repeatability it would not be possible to declare that the tester is applying the desired conditions to each component (various DUTs) identically as the customer has requested. Diagnosing tester equipment faults is important to reduce down-time and improving customer throughput.

Figure 3:
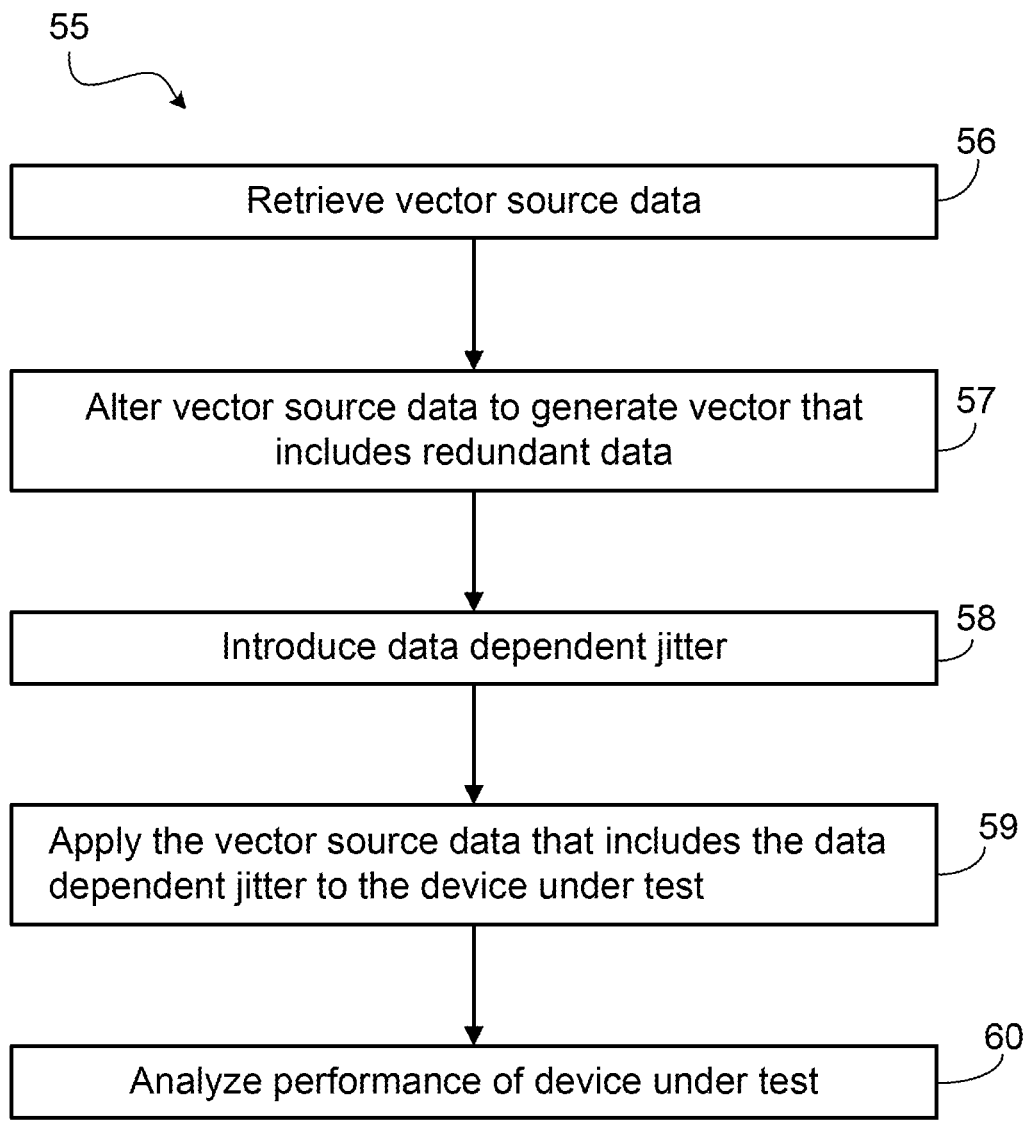
FIG. 3 is a flow chart of a testing process.

Referring to FIG. 3, a process 55 for testing the tolerance of the device under test 18 for data dependent jitter is shown. The tester 12 retrieves vector source data (56). The vector source data is a digital (e.g., 1's and 0's) or algorithmic representation of a test pattern to be applied to the device under test 18. The tester 12 alters the vector source data to generate redundant vector source data (57). In general, to generate redundant vector source data, the tester 12 replaces each digit in the non-redundant vector source data with multiple redundant samples. For example, if the non-redundant vector source data includes the pattern "0 1 0 1 0" and the testing instrument introduces four samples for each sample in the non-redundant vector source data, the resulting redundant vector source data would be "0000 1111 0000 1111 0000." Each sample in the non-redundant vector source data and/or the corresponding set of redundant samples in the redundant vector source data is referred to herein as a user interval. In the example above, the first user interval includes '0' in the non-redundant vector source data and '0000' in the redundant vector source data, the second user interval includes '1' in the non-redundant vector source data and '1111' in the redundant vector source data, the third user interval includes '0' in the non-redundant vector source data and '0000' in the redundant vector source data, and so forth.

The ratio of the number of redundant samples in the redundant vector source data to the number of samples in the non-redundant vector source data for a user interval, can be selected based on a ratio of the operating frequency of the tester 12 to the device under test 18. In order to digitally introduce data dependent jitter, the tester 12 operates at an effective rate that is faster (e.g., the operating frequency is higher) than the effective rate of the device under test 18. Due to the difference in operating frequencies, applying the redundant vector source data at the operating frequency of the tester 12 appears to the device under test 18 as though the non-redundant vector source data were being applied at the operating frequency of the device under test 18.

Figure 4:
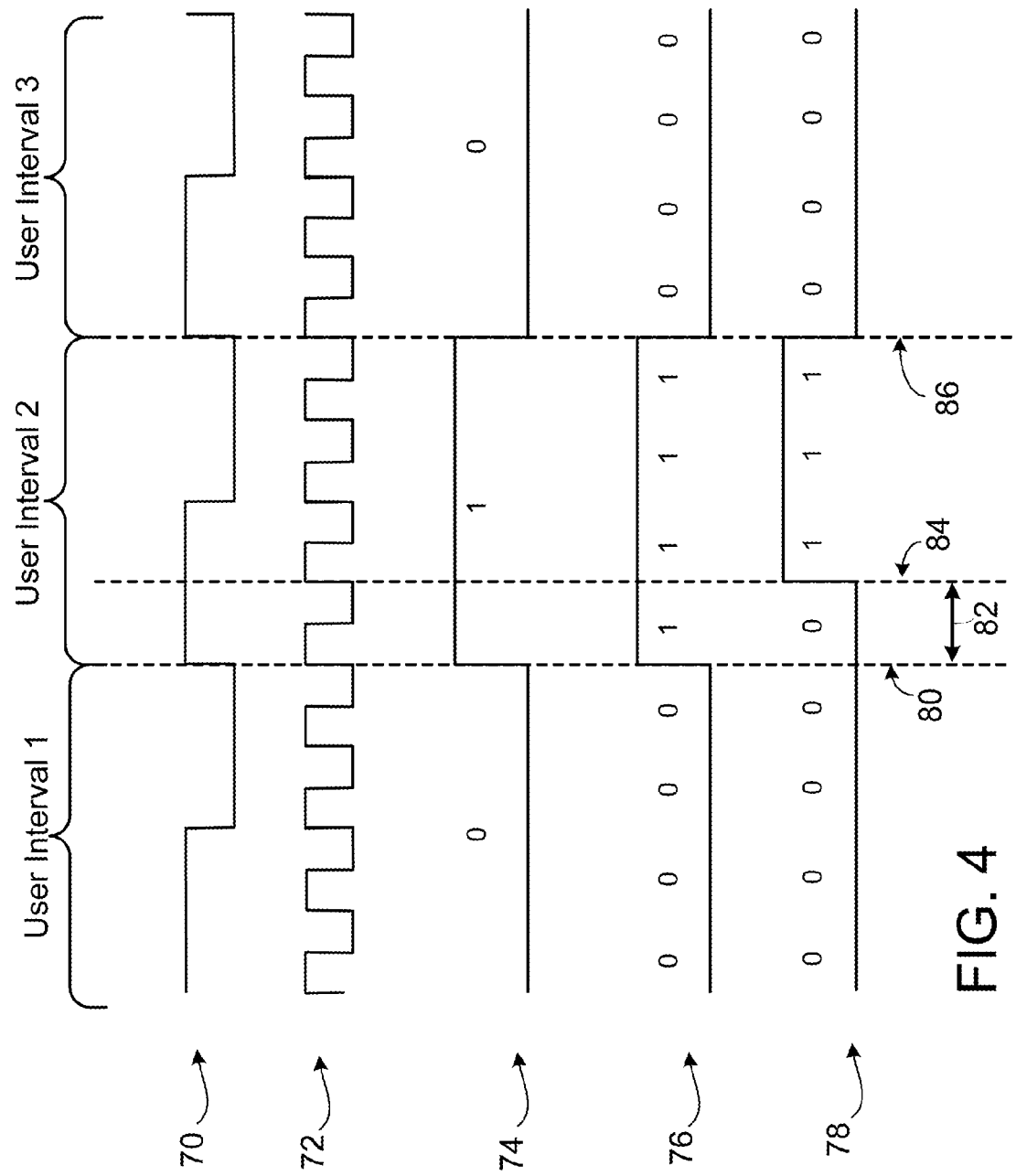
FIG. 4 is an example of timing for test signals.

For example, as shown in FIG. 4, an exemplary operating frequency for a device under test (indicated by clock signal 70 for the device under test 18) can be one-quarter the operating frequency of the tester 12 (indicated by clock signal 72 for the tester 12). Based on this example, the non-redundant vector source data (shown in line 74) includes a '0 1 0' pattern. Since the operating frequency of the testing instrument is four times greater than the operating frequency of the device under test 18, the redundant vector source data (shown in line 76) includes four redundant samples for each bit in the non-redundant vector source data 74. Thus, the redundant vector source data has the pattern of "0000 1111 0000."

Referring back to the example shown in FIG. 3 subsequent to generating the redundant vector source data, the tester 12 introduces data dependent jitter into the redundant vector source data (58). In order to introduce the data dependent jitter, the tester 12 modifies (e.g., changes from '1' or '0' or from '0' to '1') one or more bits of the redundant bits at the beginning or end of a user interval. Modifying one or more bits at the beginning of a redundant group of bits delays the transition in the test signal applied to the device under test 18 such that the signal appears to have data dependent jitter. The frequency content and the magnitude of the data dependent jitter are controlled by how often bits in the redundant vector source data are modified and the number of consecutive samples that are modified. The tester 12 applies the modified vector source data (that includes the data dependent jitter) to the device under test 18 (59) and analyzes the performance of the device under test 18 (60).

Referring back to the example shown in FIG. 4, the redundant vector source data 76 is modified to generate modified vector source data 78. In the modified vector source data 78, the first bit in the set of four redundant bits in the second user interval is changed from a '1' to a '0.' By modifying the first bit of the user interval, the expected time of the transition from '0' to '1' between the first and second user intervals is delayed by an amount of time 82 from the expected transition time 80 to the delayed transition time 84. When applied to the device under test 18, the delay in the switching time causes the test signal to appear to have data dependent jitter.

Figure 5:
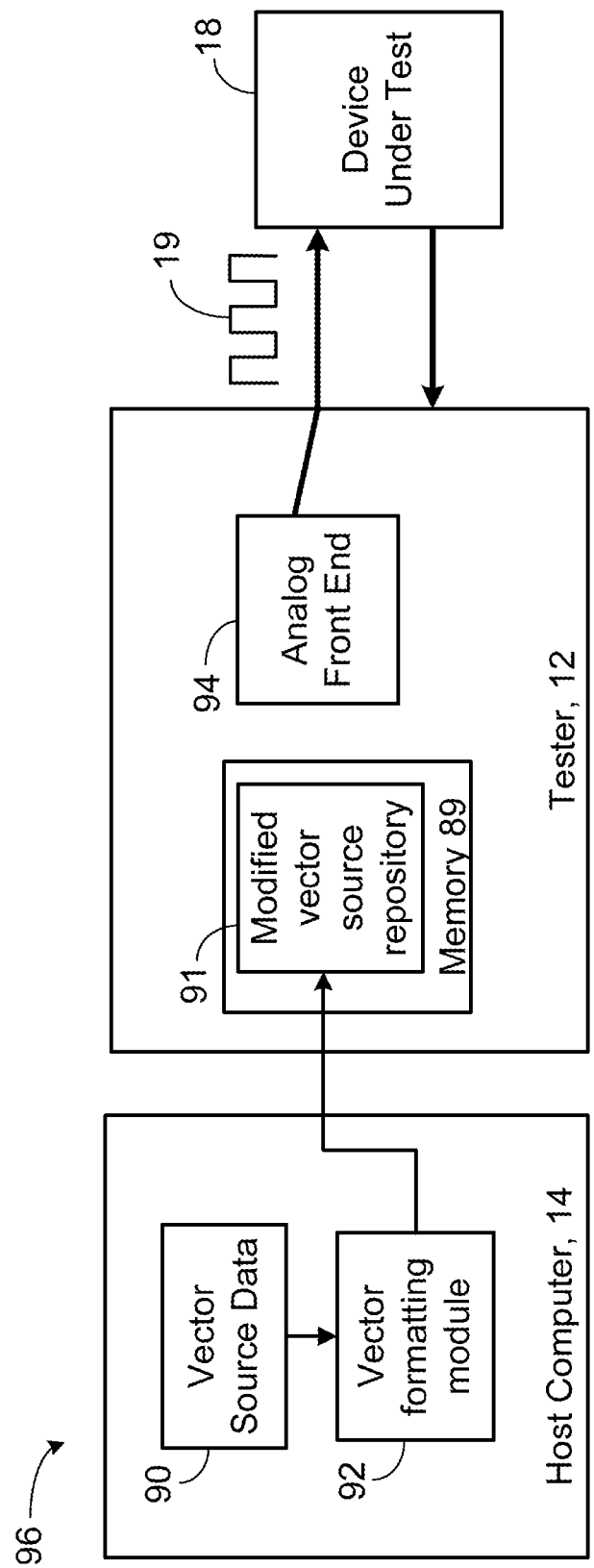
FIG. 5 is a block diagram of a tester and a device under test.

Referring to FIG. 5, in some embodiments, a testing system 96 can include a host computer 14 that uses software to modify vector source data 90. The host computer 14 provides the modified vector source data to a tester 12. The tester 12 applies test signal 19 based on the modified vector source data that includes data dependent jitter to the device under test 18.

The host computer 14 includes a vector formatting module 92. Module 92 includes software that causes the host computer 14 to modify non-redundant vector source data 90 into a format usable by the analog electronics of the tester 12 that operate at a higher speed than the device under test 18 (e.g., module 92 generates redundant vector source data based on originally supplied non-redundant vector source data). Module 92 also introduces, using a software-based algorithm, data dependent jitter into the redundant vector source data.

After formatting the vector source data, the host computer sends the modified vector source data to the tester 12. The tester 12 includes a memory 89 that includes a modified vector source repository 91 that stores the modified vector source data. The tester 12 also includes an analog front end device 94 that applies the modified redundant vector source data stored in the modified vector source repository 91 to the device under test 18 at the operating speed of the testing instrument (e.g., a frequency greater than the operating frequency of the device under test 18). The modification of vector source data to introduce jitter is described in more detail below in relation to FIG. 6.

Figure 6:
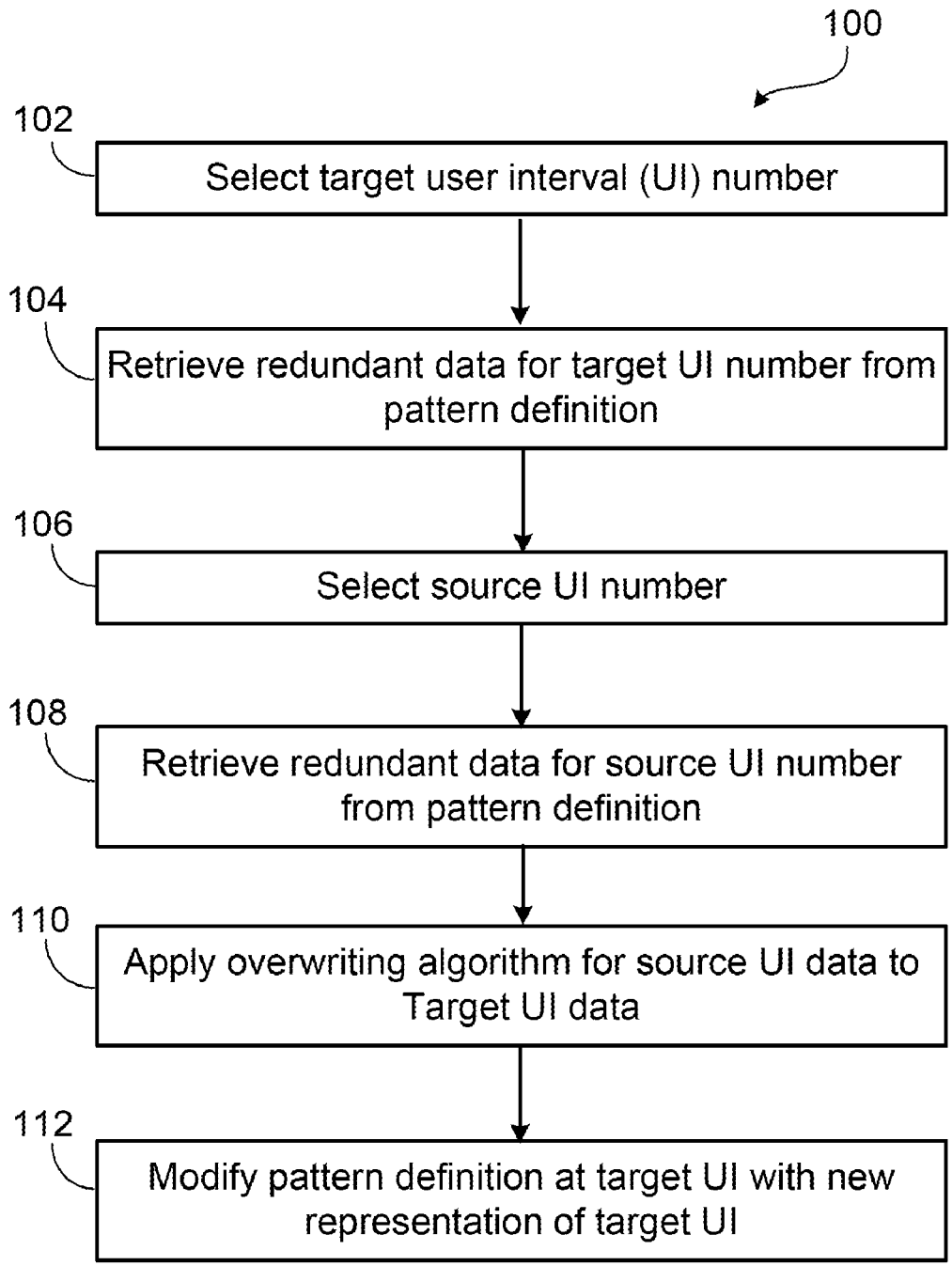
FIG. 6 is a flow chart, of a data modification process.

Referring to FIG. 6, a vector formatting process 100 used by module 92 to modify redundant vector source data to generate a test signal that includes data dependant jitter is shown. Based on an algorithm, the vector formatting module 92 selects a target user interval number (102). The target user interval number indicates a user interval in the redundant vector source data that will potentially be modified by the formatting process 100 to include data dependent jitter. The vector formatting module 92 retrieves the redundant vector source data for the target user interval (104). In order to modify the user interval the vector formatting module 92 also uses information about the contents of a user interval preceding and/or subsequent to the selected target user interval referred to as a source user interval. The vector formatting module 92 selects a source user interval number (106). The source user interval number indicates a user interval in the redundant vector source data that provides information used by tester 12 to modify the target user interval. The vector formatting module 92 retrieves the redundant vector source data for the source user interval (108). After retrieving the redundant source data for both the target and source user intervals, the vector formatting module 92 applies an overwriting algorithm to overwrite one or more samples of the target user interval with one or more samples from the source user interval (110). Subsequently, the vector formatting module 92 stores the modified data for the target user interval (112) in memory 89. Thus, process 100 overwrites the original vector source data with the new, modified vector source data. The modified vector source data will appear to have data dependent jitter as observed from the perspective of the device under test 18.

Figure 7:
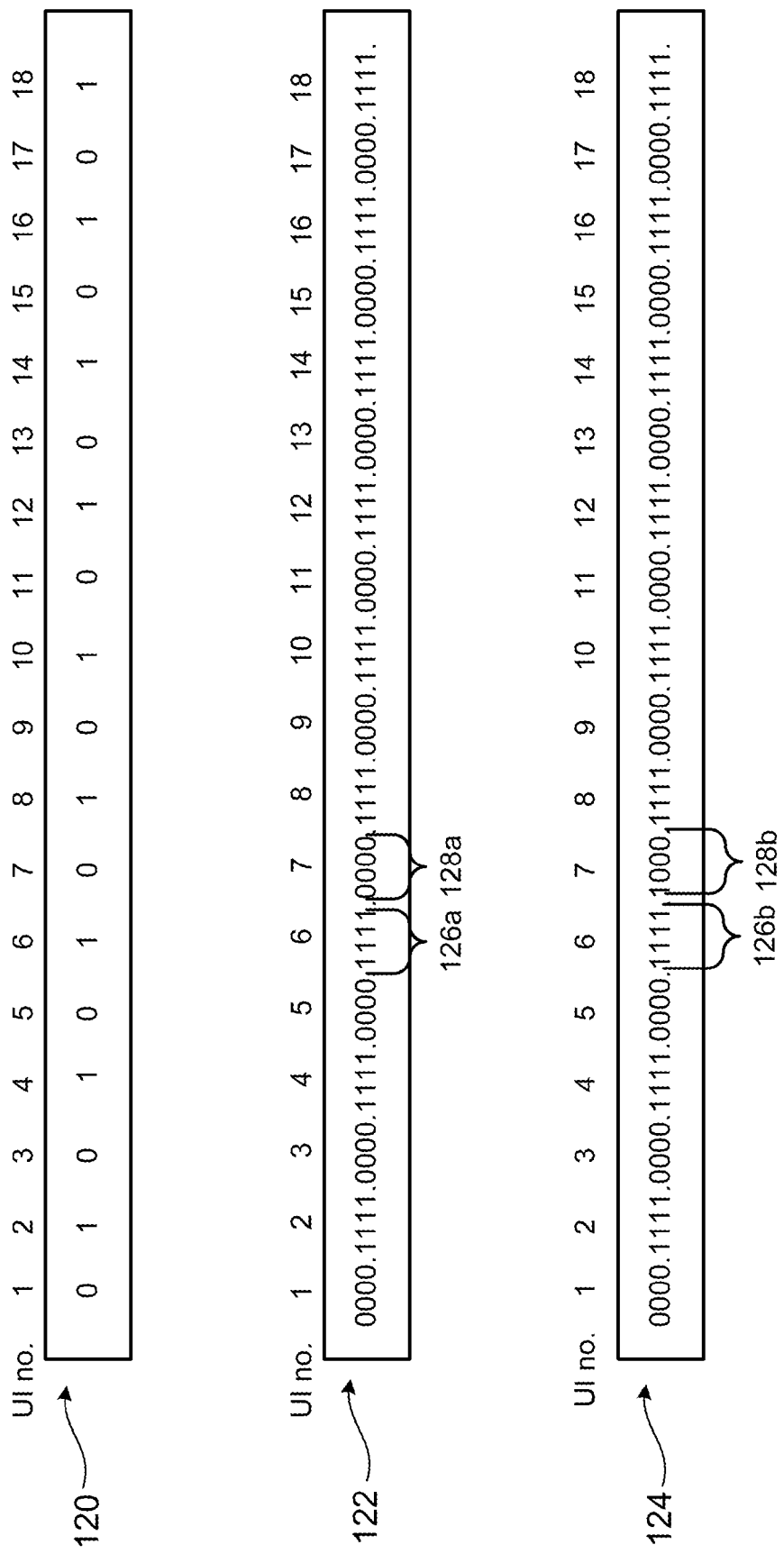
FIG. 7 shows exemplary non-redundant test data, redundant test data, and modified test data

Referring to FIG. 7, an exemplary modification of vector source data using process 100 is shown. In this example, the tester 12 operates at four times the operating frequency of the device under test 18. The vector formatting module 92 receives non-redundant vector source data (the first eighteen user intervals of which are shown in block 120) and overwrites the non-redundant vector source data with redundant vector source data (the first eighteen user intervals of which are shown in block 122). The vector formatting module 92 selects a target user interval (102) and retrieves the redundant data for the target user interval (104). In this example, the target user interval is user interval number 7 so the vector formatting module 92 retrieves the redundant data of '0000' (indicated by arrow 128a). The vector formatting module 92 also selects a source interval (106) and retrieves the redundant data for the source user interval (108). In this example, the source user interval is the user interval preceding the target user interval 128a, namely user interval number 6 (indicated by arrow 126a). As such, the vector formatting module 92 retrieves the redundant data of '1111' from user interval number 6. The vector formatting module 92 overwrites the first bit of the target user interval, e.g., interval number 7, with the last bit from the source user interval, e.g., interval number 6 (110) to generate a modified user interval as indicated by arrow 128b. Thus, since the source user interval included samples of '1111' and the target user interval included samples of '0000,' overwriting the first sample of the target user interval with the last sample of the source user interval results in the modified target user interval being '1000.' The vector formatting module 92 stores the modified test pattern (the first eighteen user intervals of which are shown in block 124) for application to the device under test 18.

Figure 8:
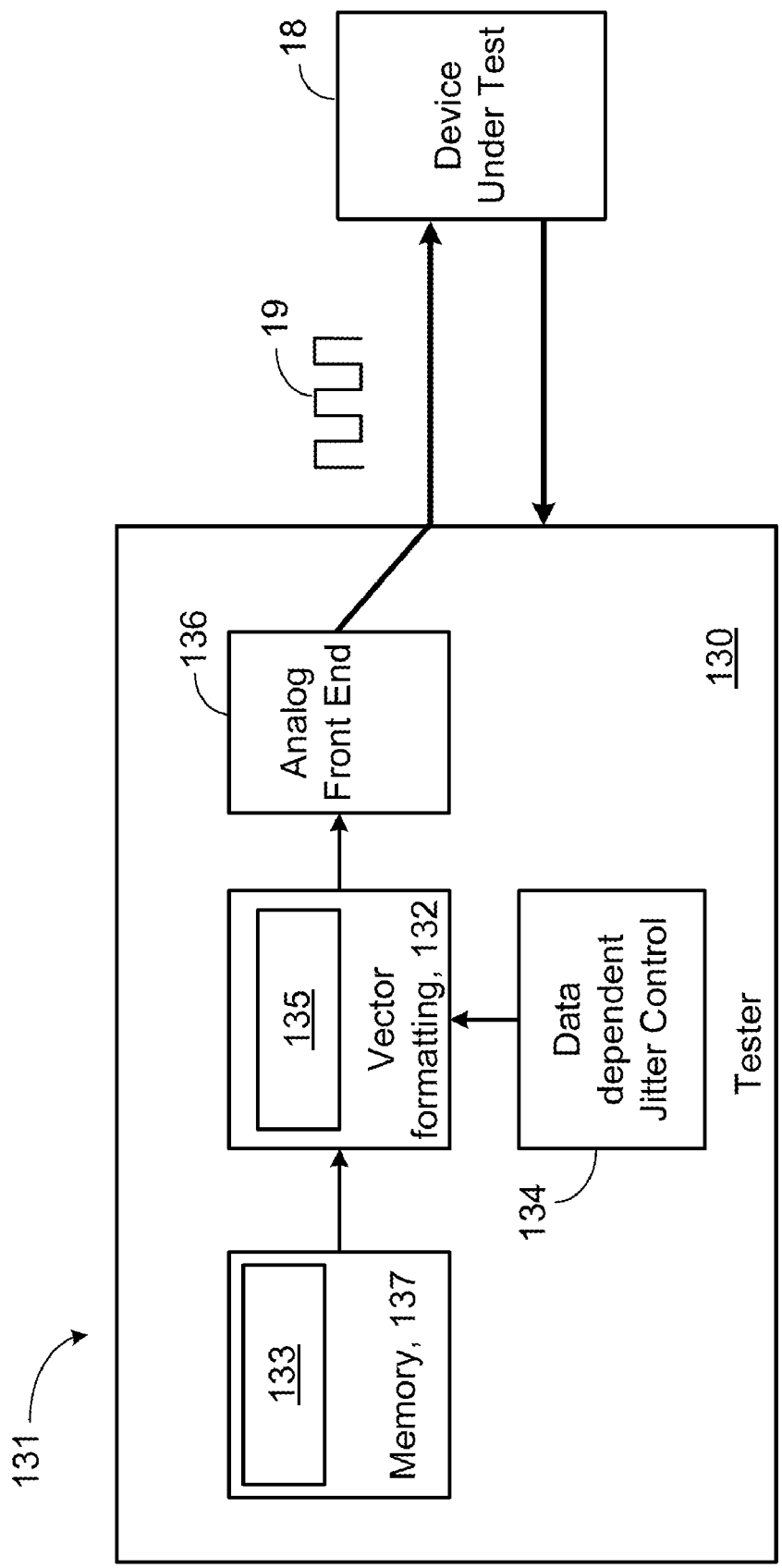
FIG. 8 is a block diagram of a tester and a device under test.

Referring to FIG. 8, in some embodiments, a testing system 131 includes a tester 130 that uses a hardware based algorithm, to modify vector source data and provide a test signal 19 that appears to have data dependent jitter from the perspective of a device under test 18. The tester 130 includes a memory 137 that stores vector source data 133, a vector formatting transfer function block 132, a data dependent jitter control block 134, and an analog front end 136. The vector formatting transfer function block 132 and the data dependent jitter control block 134 alter the original vector source data 133 to generate a modified vector source pattern 135 without modifying the original vector source data 133 stored in memory 137. In order to generate the modified vector source pattern 135, the vector formatting transfer function block 132 translates the original vector source pattern 133 into a redundant vector source pattern that is in a format usable by the analog front end 136. The data dependent jitter control block 134 introduces data dependent jitter into the redundant user pattern by modifying the redundant data to generate the altered vector source pattern 135.

Figure 9:
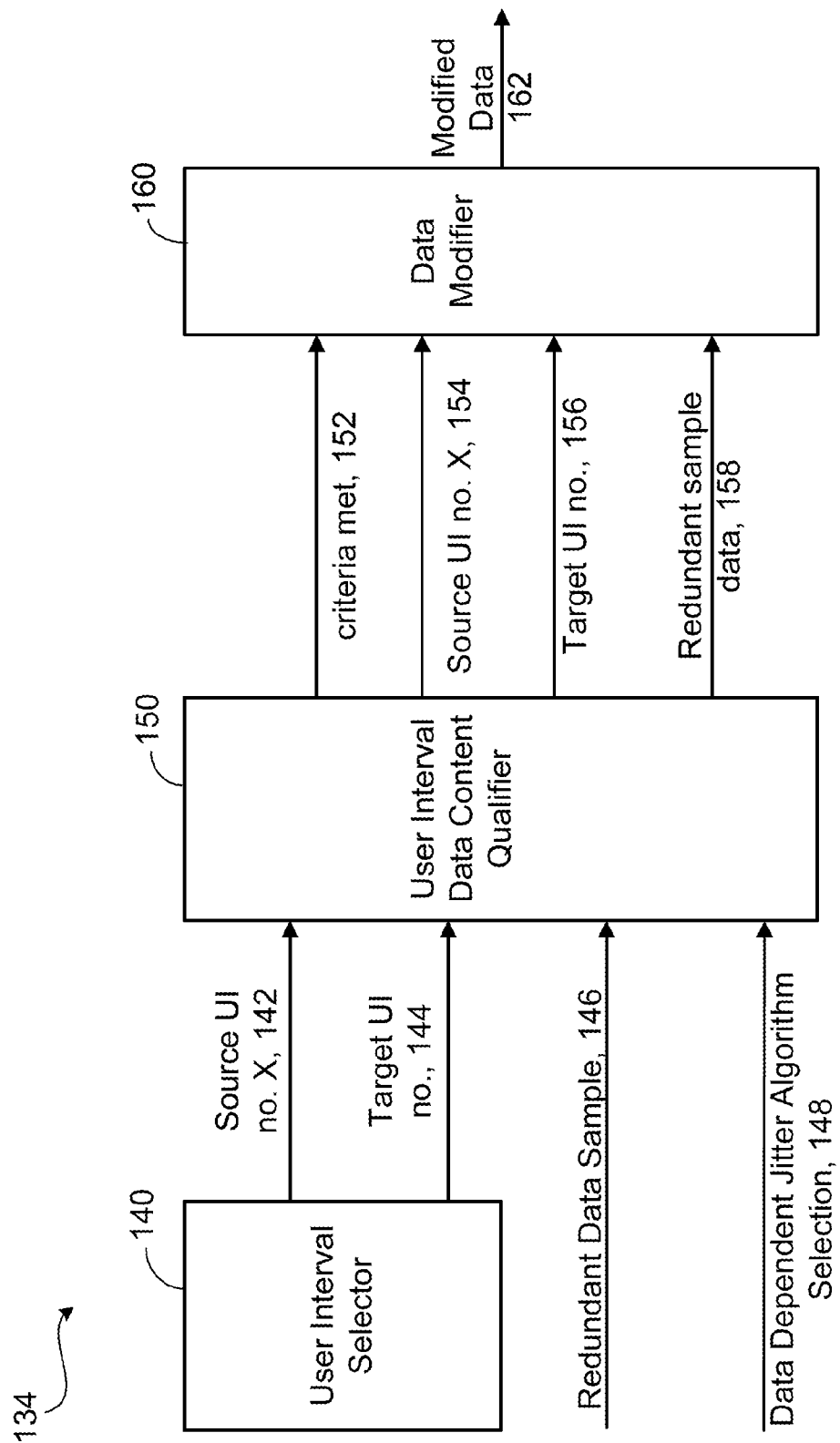
FIG. 9 is a block diagram of components of a tester.

More particularly, as shown in FIG. 9, the data dependent jitter control block 134 includes a user interval selector 140, a user interval data content qualifier 150, and a data modifier 160. The user interval selector 140 identifies the appropriate user intervals (e.g., a target user interval and a source user interval) from a redundant data sample and provides the user interval numbers to the user interval data qualifier 150. The user interval data qualifier 150 identifies, based on a jitter algorithm, whether to modify the target user interval selected by the user interval selector 140. If the user interval data qualifier 150 determines that a particular user interval should be modified, the data modifier 160 modifies the user interval to introduce data dependent jitter into the signal and provides the modified data 162 to the analog front end 136 of tester 130.

Figure 10:
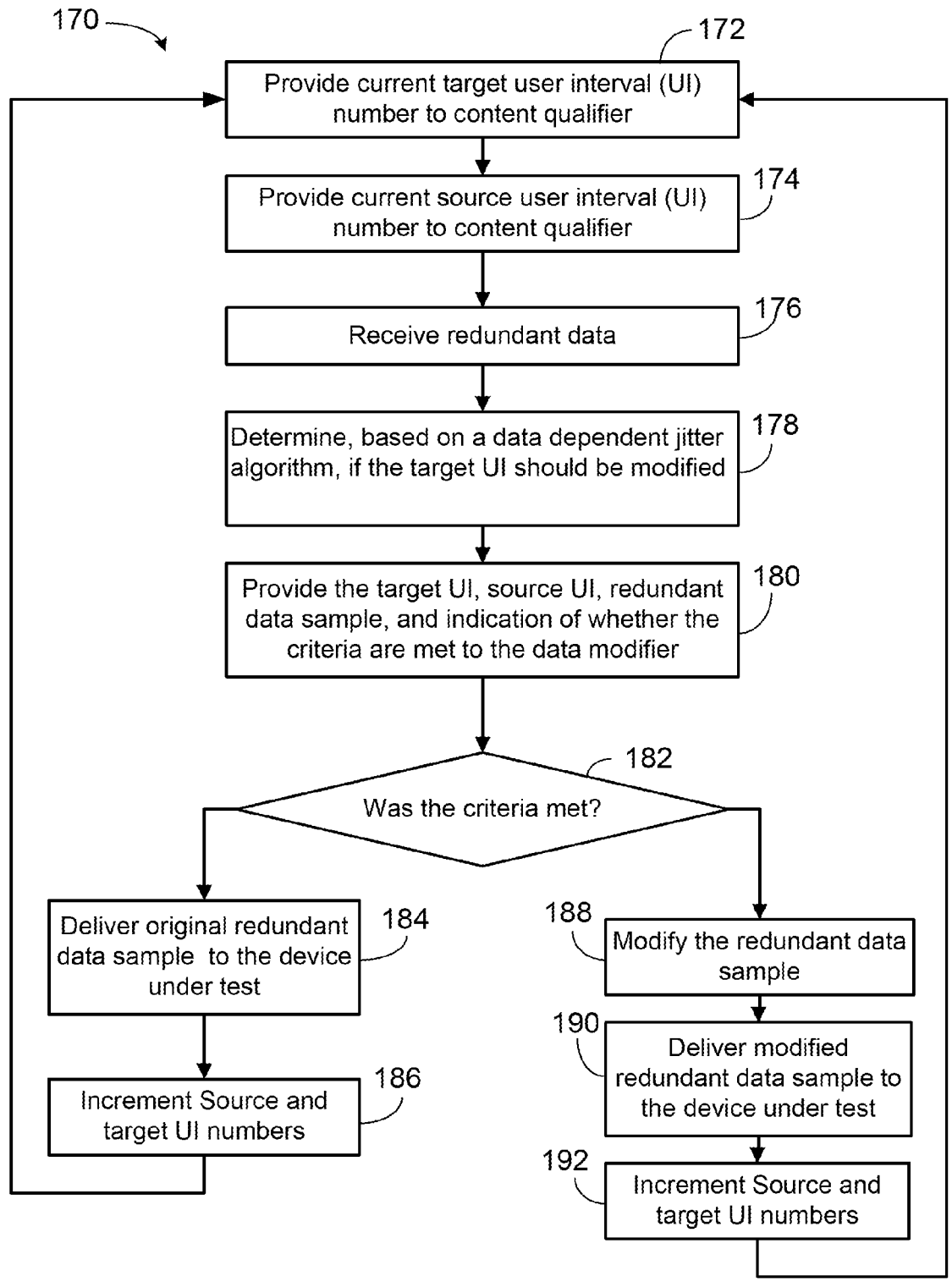
FIG. 10 is a flow chart of a test data modification process.

Referring to FIG. 10, an exemplary process 170 for modifying vector source data 133 to introduce data dependent jitter using testing system 131 is shown. The user interval selector 140 provides a current source user interval number 142 to the content qualifier 150 (172) and provides a current target user interval number 144 to the content qualifier 150 (174). Based on the received source and target user interval numbers 142 and 144, the content qualifier 150 retrieves the associated redundant data samples 146 from the vector formatting transfer function block 132 (176). The content qualifier 150 determines if the target user interval should be modified (178) and provides a signal 152 that indicates whether the target user interval should be modified to the data modifier 160. The content qualifier 150 also provides the redundant data samples 158 to the data modifier 160. The data modifier 160 determines, based on signal 152, whether the target data should be modified (182). If the target user interval data should be modified, the data modifier 160 modifies the redundant data sample (188) and delivers the modified redundant data sample to the analog front end 136 for application to the device under test 18 (190). The user interval selector 140 increments the source and target user interval numbers and process 170 is repeated (192). If the target user interval data does not need to be modified, the data modifier 160 delivers the original, redundant data sample to the analog front end 136 for application to the device under test 18 (184). The user interval selector 140 increments the source and target user interval numbers and process 170 is repeated (186) using the updated target and source user interval numbers.

Figure 11:
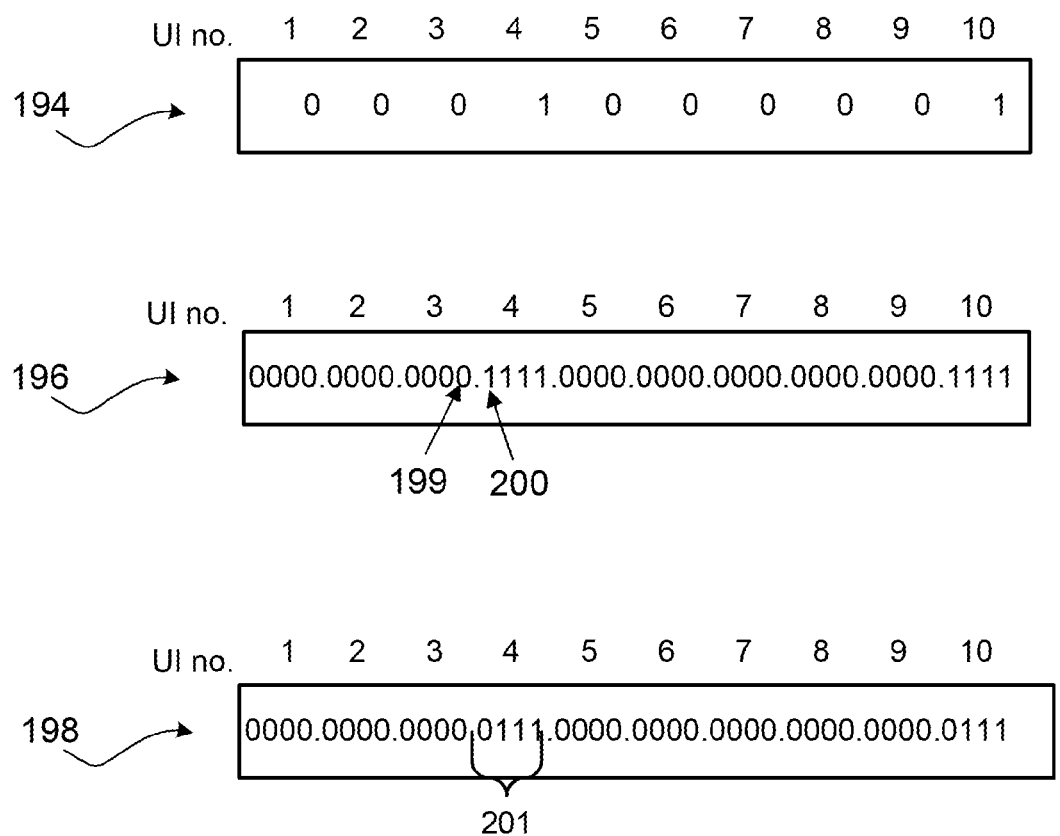
FIG. 11 shows exemplary non-redundant test data, redundant test data, and modified test data.

Referring to FIG. 11, an exemplary modification of original vector source data 194 using process 170 is shown. The vector formatting transfer function formats the original vector source data 194 to generate redundant vector source data 196. In this example, four redundant samples are used to replace each sample in the original vector source data 194 and the data dependent jitter control 134 is programmed (or hard coded) to introduce data dependent jitter into each low to high transition. The first three user intervals (UI no. 1, UI no. 2, and UI no. 3) are each low, so no modification of the redundant vector source data 196 is necessary. When the user interval selector 140 reaches the target user interval number 4 and the source user interval number 3, the user interval data content qualifier 150 determines that the criteria of a low to high transition has been satisfied (e.g., the lot to high transition can function as the criteria used as the criteria check for 182 of FIG. 10). Since this transition satisfies the conditions for inserting data dependent jitter, the user interval data content qualifier 150 sends a signal 152 to the data modifier 160 indicating that the fourth user interval should be modified. The data modifier replaces the first bit of the fourth user interval (indicated by arrow 200) with the last bit of the third user interval (indicated by arrow 199) so that, after insertion of the data dependent jitter, the fourth user interval is '0111' as indicated by arrow 201.

Figure 12:
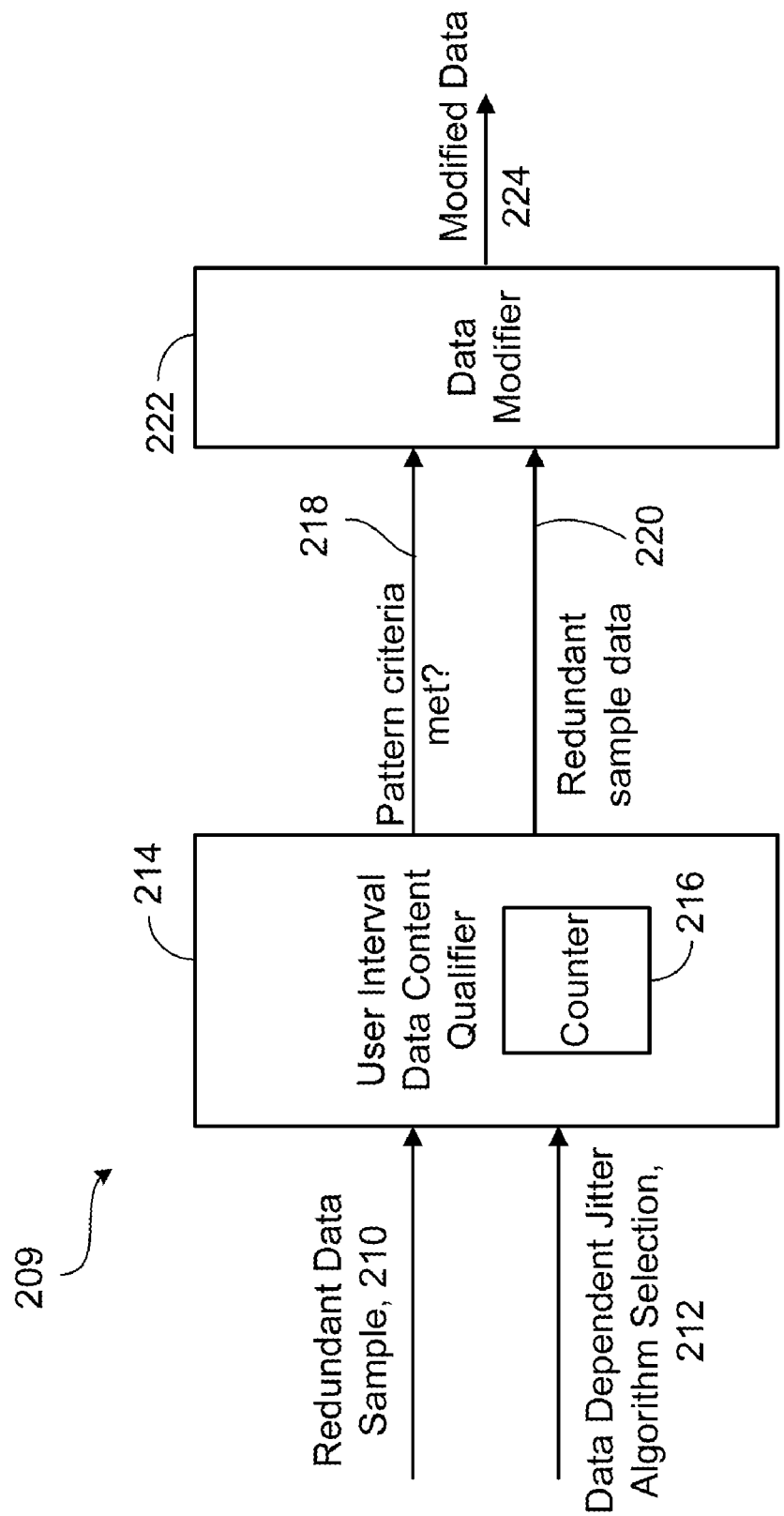
FIG. 12 is a block diagram of components of a tester.

Referring to FIG. 12, in some embodiments, a system 209 can be configured to insert data dependent jitter upon the logic low/high or high/low transition when the signal has remained in the logic opposite state for a predetermined number of user intervals. For example, if the signal has remained in the low logic state for multiple user intervals, data dependent jitter could be inserted to delay the transition from low to high. In order to insert data dependent jitter based on a number of cycles the test signal has been in the same state prior to the transition, the system 209 includes a user interval data content qualifier 214 that includes a counter 216. The counter 216 maintains a running total of the number of user intervals the redundant data sample has remained in the same logical state. Similar to the testing system described above, if the criteria for inserting data dependent jitter tire satisfied, the user interval data content, qualifier 214 sends a signal 218 to the data modifier 282 and the data modifier 282 modifies the user interval of the redundant data sample.

Figure 13:
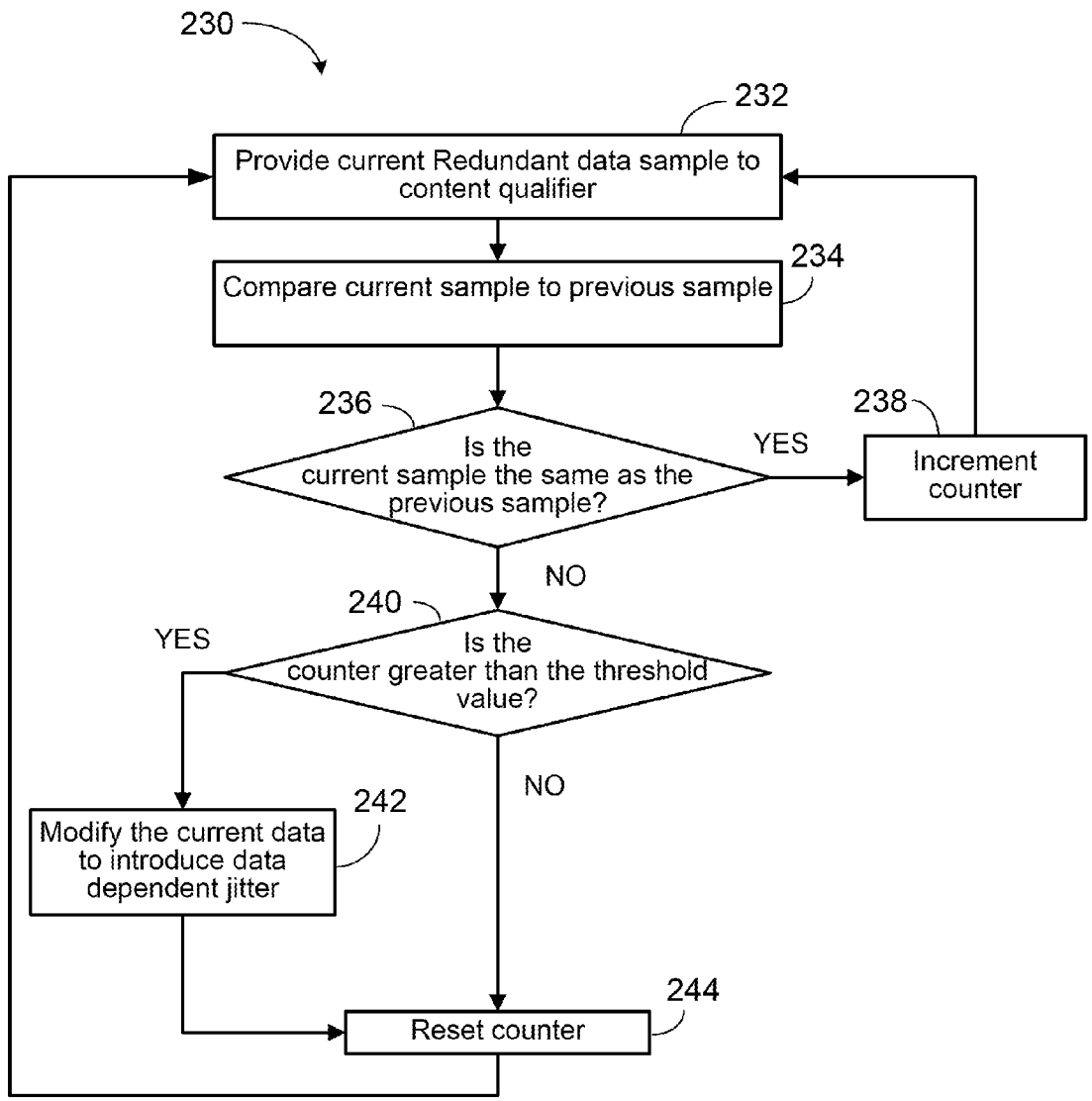
FIG. 13 is a flow chart of a data modification process.

Referring to FIG. 13, a process 230 for inserting data dependent jitter into a test signal using system 209 is shown. The user interval data content qualifier 214 receives the current (e.g., the target) redundant data sample (232). The user interval data content qualifier 214 compares the current redundant data sample to the previous (e.g., the source) redundant data sample (234) and determines if the current sample has the same logical state (e.g., 0 or 1) as the previous data sample (236). If the sample has the same logical state as the previous sample, the user interval data content qualifier 214 increments the counter 216 (238). If the current sample is different than the previous sample indicating that a logical transition has occurred (236), the user interval data content qualifier 214 determines if the current, value of the counter 216 is greater than or equal to a threshold value (240). If the counter's value is less than the threshold value, the user interval data content qualifier 214 resets the counter (244) and does not modify the current, target user interval data if the counter's value is greater than or equal to the threshold value, the data modifier 222 modifies the current data to introduce data dependent jitter (242) and resets the counter (244).

Figure 14:
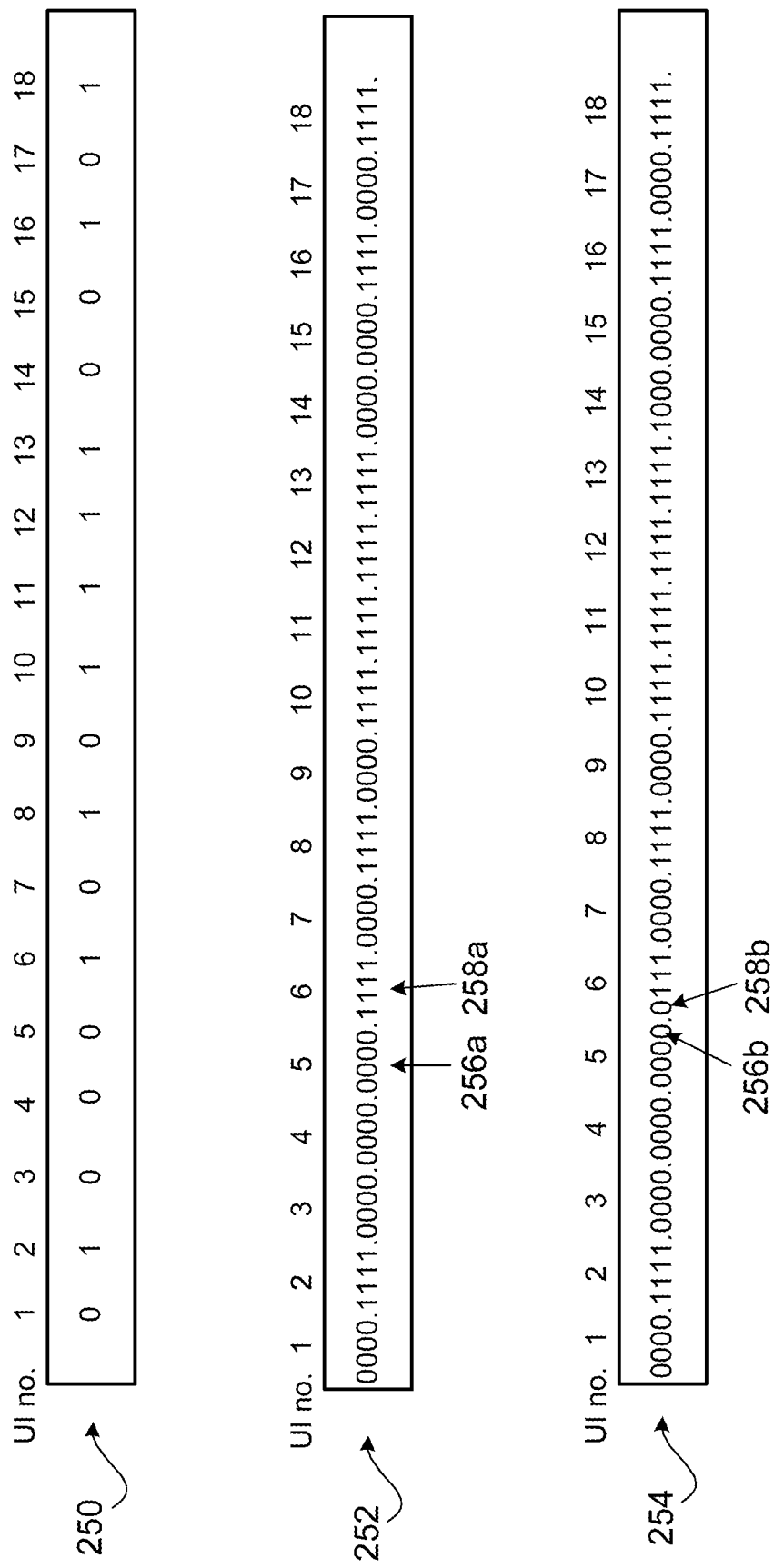
FIG. 14 shows exemplary non-redundant test data, redundant test data, and modified test data

Referring to FIG. 14, an exemplary modification of vector source data using process 230 is shown. The vector formatting module formats the original vector source data 250 to generate redundant vector source data 252. In this example, four redundant samples are used to replace each sample in the original vector source data 250. The user interval data content qualifier 214 introduces jitter based on the number of cycles the redundant vector source data 210 has remained in a logic state prior to transition to the other logic state. In this example, the threshold value for inserting data dependent jitter is three. However, other numbers of cycles (e.g., 2, 4, 5, 6, 7, 8, 9, 10. etc.) could be used for the threshold. Initially, the user interval data content qualifier 214 sets the counter 216 to one. Since the first logic level transition is from the first user interval (UI no. 1) to the second user interval (UI no. 2), the second user interval will not be modified. After the transition, the user interval data content qualifier 214 resets the counter 216 to one. The user interval selector updates the target UI to the third user interval and the source user interval is updated to the second user interval. The source and target have different logic levels and the counter is one so the user interval data content qualifier 214 resets the counter and increments the source and target user interval numbers to 3 and 4, respectively. The third and fourth user intervals have the same logic level, so the user interval data content qualifier 214 increments the counter to 2 and increments the source and target user interval numbers to 4 and 5. The fourth and fifth user intervals have the same logic level, so the user interval data content qualifier 214 increments the counter to 3 and increments the source and target user interval numbers to 5 and 6. The fifth and sixth user intervals (indicated by arrows 256a and 258a, respectively) have the different logic levels and the current counter is 3 indicating there have been three user intervals with the same logic level preceding the low to high transition. Since the counter is equal to the threshold, the user interval data content qualifier 214 sends a signal to the data modifier 222 to modify the sixth user interval. The data modifier 222 replaces the first bit of the sixth user interval (indicated by arrow 258b) with the last bit of the third user interval (indicated by arrow 256b) so that, after insertion of the data dependent jitter, the sixth user interval is '0111'. In parallel with the modification of the source sample data, the counter (216) is reset to 1.

While various algorithms for modifying vector source data have been described above, other algorithms are possible. In general, any algorithm that can be represented in hardware and/or software could be used. In one example, the data dependent jitter algorithm could modify data at a predefined repeating interval. In another example, the data dependent jitter algorithm could modify data at a series of predefined repeating intervals where the stepping through these intervals is a definable sequence. In an additional example, the data dependent jitter algorithm could modify data at a series of points as defined by a predefined pseudo random interval. In another example, the data dependent jitter algorithm could modify data at a series of points as defined by translation of the user pattern stream such as every logical transition or every other logical transition.

While in the examples described above, a ratio of the number of bits in the redundant vector source data to the non-redundant vector source data has been shown as 4, other ratios are possible. In general, the ratio of the number of redundant bits in the redundant vector source data to the number of bits in the non-redundant vector source data for a user interval, can be selected based on a ratio of the operating frequency of the testing instrument to the operating frequency of the device under test. For example, the ratio can be at least about 4 (e.g., about 5, about 6, about 7, about 8, about 9, about 10). The frequency and magnitude of the data dependent jitter are controlled by how often the pattern data is modified and the number of consecutive samples altered from their original state. The table below shows exemplary jitter magnitude percentages based on the total number of samples and the number of modified samples in a user interval.

| Ratio of operating frequencies | Number of samples in redundant data | Number of samples modified | Aprox. magnitude of jitter |
|---|---|---|---|
| 4 | 4 | 1 | 25% |
| 5 | 5 | 1 | 20% |
| 5 | 5 | 2 | 40% |

-continued

| Ratio of operating frequencies | Number of samples in redundant data | Number of samples modified | Aprox. magnitude of jitter |
|---|---|---|---|
| 6 | 6 | 1 | 17% |
| 6 | 6 | 2 | 33% |
| 7 | 7 | 1 | 14% |
| 7 | 7 | 2 | 28.5% |
| 7 | 7 | 3 | 43% |
| 8 | 8 | 1 | 12.5% |
| 8 | 8 | 2 | 25% |
| 8 | 8 | 3 | 37.5% |
| 9 | 9 | 1 | 11% |
| 9 | 9 | 2 | 22% |
| 9 | 9 | 3 | 33% |
| 9 | 9 | 4 | 44% |
| 10 | 10 | 1 | 10% |
| 10 | 10 | 2 | 20% |
| 10 | 10 | 3 | 30% |
| 10 | 10 | 4 | 40% |

The processes described herein are not limited to use with the hardware and software described herein. The processes described herein can be implemented in digital electronic circuitry, or in computer hardware, firmware, software, or in combinations thereof.

All or parts of the processes described herein can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated, with implementing processes described herein can be performed by one or more programmable processors executing one or more computer programs to perform the functions of the processes. All or part of the processes described herein can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

A number of embodiments of the invention have been described. Nevertheless, it will be understood that various modifications may be made without departing from the spirit and scope of the invention. Elements of different embodiments may be combined to produce embodiments not specifically described herein.

Accordingly, other embodiments are within the scope of the following claims.

What is claimed is:

1. A method, comprising:
generating a test pattern that comprises a plurality of intervals, each of the intervals comprising a number of redundant samples corresponding to a sample in a test source pattern, wherein the number of redundant samples is based on a difference between an operating frequency of a tester and an operating frequency of a device under test, the operating frequency of the tester being greater than the operating frequency of the device under test; and
digitally modifying the test pattern to generate a modified test pattern that includes data dependent jitter.

2. The method of claim 1, further comprising applying the modified test pattern to the device under test at the operating frequency of the tester.

3. The method of claim 1, wherein digitally modifying the test pattern comprises replacing one or more samples from a particular interval with a sample from an interval preceding the particular interval.

4. The method of claim 3, wherein replacing the one or more samples comprises replacing the first sample in the interval with the last sample from an immediately preceding interval.

5. The method of claim 1, wherein digitally modifying the test pattern comprises replacing one or more samples from a particular interval with a sample from an interval subsequent to the particular interval.

6. The method of claim 5, wherein replacing the one or more samples comprises replacing the final sample in the interval with the first sample from an immediately subsequent interval.

7. The method of claim 1, further comprising:
determining, based on user input, an amount of data dependent jitter to introduce into the test pattern; and
determining whether to modify one or more samples of a particular interval of the test pattern based on the determined amount of data dependent jitter.

8. The method of claim 1, further comprising:
receiving a data dependent jitter algorithm; and
determining whether to modify one or more samples of a particular interval of the test pattern based on the algorithm.

9. The method of claim 1, further comprising determining whether to modify one or more samples of a particular interval of the test pattern based on an algorithm stored in a memory included in the tester.

10. The method of claim 1, wherein modifying the test pattern comprises:
applying a software-based algorithm to modify the test pattern; and
overwriting the test pattern with the modified test pattern.

11. The method of claim 10, wherein applying a software-based algorithm to modify the test pattern comprises:
during a first cycle, applying a software-based algorithm to modify the test pattern; and
during a second cycle, applying a software-based algorithm to modify the test pattern, the modifications generated during the first cycle being identical to the modifications generated during the second cycle.

12. The method of claim 1, wherein modifying the test pattern comprises modifying the test pattern in real time using a circuit included in the tester.

13. The method of claim 12, wherein modifying the test pattern comprises further
during a first cycle, applying a software-based algorithm to modify the test pattern; and
during a second cycle, applying a software-based algorithm to modify the test pattern, the modifications generated during the first cycle being identical to the modifications generated during the second cycle.

14. The method of claim 1, wherein the number of samples is about equal to a ratio of the operating frequency of the tester to the operating frequency of the device under test.

15. A testing system, comprising:
a tester configured to:
generate a test pattern that comprises a plurality of intervals, each of the intervals comprising a number of redundant samples corresponding to a sample in a test source pattern, wherein the number of redundant samples is based on a difference between an operating frequency of a tester and an operating frequency of a device under test, the operating frequency of the tester being greater than the operating frequency of the device under test; and
digitally modify the test pattern to generate a modified test pattern that includes data dependent jitter.

16. The testing system of claim 15, wherein the tester further comprises an analog front end configured to apply the modified test pattern to the device under test at the operating frequency of the tester.

17. The testing system of claim 15, wherein the configurations that cause the tester to digitally modify the test pattern further comprise configurations to replace one or more samples from a particular interval with a sample from an interval preceding the particular interval.

18. The testing system of claim 17, wherein the configurations that cause the tester to replace the one or more samples comprise configurations to cause the tester to replace the first sample in the interval with the last sample from an immediately preceding interval.

19. The testing system of claim 15, wherein the configurations that cause the tester to digitally modify the test pattern further comprise configurations to replace one or more samples from a particular interval with a sample from an interval subsequent to the particular interval.

20. The testing system of claim 19, wherein the configurations that cause the tester to replace the one or more samples comprise configurations to cause the tester to replace the final sample in the interval with the first sample from an immediately subsequent interval.

21. The testing system of claim 15, further comprising a memory configured to store an algorithm for determining whether to modify one or more samples of a particular interval of the test pattern.

* * * * *

UNITED STATES PATENT AND TRADEMARK OFFICE
CERTIFICATE OF CORRECTION

PATENT NO.         : 7,536,621 B2                                            Page 1 of 1
APPLICATION NO.    : 11/608460
DATED              : May 19, 2009
INVENTOR(S)        : John R. Pane It is certified that error appears in the above-identified patent and that said Letters Patent is hereby corrected as shown below:

Col. 14, line 7, In Claim 13, delete "comprises further" and insert -- further comprise: --, therefore.

Signed and Sealed this

Twenty-ninth Day of September, 2009

David J. Kappos
*Director of the United States Patent and Trademark Office*